United States Patent
Ito

(10) Patent No.: US 9,082,646 B2
(45) Date of Patent: Jul. 14, 2015

(54) LOW THRESHOLD VOLTAGE METAL OXIDE SEMICONDUCTOR

(75) Inventor: Akira Ito, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 13/552,349

(22) Filed: Jul. 18, 2012

(65) Prior Publication Data

US 2014/0021543 A1    Jan. 23, 2014

(51) Int. Cl.
| | |
|---|---|
| H01L 29/76 | (2006.01) |
| H01L 29/94 | (2006.01) |
| H01L 29/10 | (2006.01) |
| H01L 29/423 | (2006.01) |
| H01L 29/78 | (2006.01) |
| H01L 29/06 | (2006.01) |
| H01L 29/08 | (2006.01) |

(52) U.S. Cl.
CPC .......... *H01L 29/1045* (2013.01); *H01L 29/086* (2013.01); *H01L 29/42368* (2013.01); *H01L 29/7816* (2013.01); *H01L 29/7835* (2013.01); *H01L 29/0638* (2013.01); *H01L 29/0653* (2013.01); *H01L 29/0847* (2013.01); *H01L 29/1083* (2013.01)

(58) Field of Classification Search
CPC ................................ H01L 29/78; H01L 29/06

USPC .......... 257/341–342, 343, E29.261; 438/140, 438/270, 286, 454
See application file for complete search history.

(56) References Cited

U.S. PATENT DOCUMENTS

| | | | | |
|---|---|---|---|---|
| 7,161,213 | B2 | 1/2007 | Ito et al. | 257/349 |
| 2006/0261408 | A1* | 11/2006 | Khemka et al. | 257/335 |
| 2009/0020813 | A1* | 1/2009 | Voldman | 257/343 |
| 2009/0114987 | A1* | 5/2009 | Tanaka | 257/335 |
| 2010/0295125 | A1 | 11/2010 | Ito | |

OTHER PUBLICATIONS

Korean Office Action for KR Application No. 10-2013-0084534, dated Jun. 25, 2014, (5p).

* cited by examiner

*Primary Examiner* — Theresa T Doan
(74) *Attorney, Agent, or Firm* — Brinks Gilson & Lione

(57) ABSTRACT

A semiconductor device includes a source region disposed with a semiconductor substrate; a drain region disposed with the semiconductor substrate; a gate region disposed onto the semiconductor substrate and positioned between the source region and the drain region. The semiconductor device also includes a gate oxide region disposed onto the semiconductor substrate in contact with the gate region and a well region implanted onto the semiconductor substrate and under the gate region and the gate oxide region. The gate oxide region has a lower outer edge portion that contacts the well region.

20 Claims, 3 Drawing Sheets

LOW THRESHOLD VOLTAGE METAL OXIDE SEMICONDUCTOR

TECHNICAL FIELD

This disclosure relates generally to a metal oxide semiconductor field effect transistor (MOSFET). More particularly, it relates to a low threshold voltage split gate high performance laterally diffused metal oxide semiconductor (LDMOS).

BACKGROUND

Silicon semiconductor processing has evolved sophisticated operations for fabricating integrated circuits. As advancement in fabrication process technology continues, the core and IO operating voltages of integrated circuits have decreased. However, operating voltages of auxiliary devices remain the same. The auxiliary devices include devices used in conjunction with the integrated circuits. For example, the auxiliary devices may be any device coupled with the integrated circuits such as printers, scanners, disk drives, tape drives, microphones, speakers, or cameras.

An integrated circuit may include an interconnected array of active and passive elements, such as, transistors, resistors, capacitors, inductors to provide some examples, integrated with or deposited on a substrate by a continuous series of compatible processes. The auxiliary devices may operate at voltages above a breakdown voltage of the transistors contained within the integrated circuit. As the operating voltages applied to the transistors increase, the transistors will eventually breakdown allowing an uncontrollable increase in current. Breakdown voltage is a voltage level where this uncontrollable increase in current occurs. Examples of breakdown may include punch-through, avalanche breakdown, and gate oxide breakdown to provide some examples. Operating above the breakdown voltage for a significant duration reduces the lifetime of the transistors.

BRIEF DESCRIPTION OF THE DRAWINGS

The disclosed method and apparatus may be better understood with reference to the following drawings and description. In the figures, like reference numerals designate corresponding parts throughout the different views.

DETAILED DESCRIPTION

In conventional LDMOS, the threshold voltage is high and there is not much head room to design high performance circuits. Thus, it is desirable to have higher performance, high voltage and low threshold LDMOS without additional mask or processing cost.

The description below relates to a semiconductor device such as an LDMOS. The semiconductor device includes the following: a source region disposed with a semiconductor substrate; a drain region disposed with the semiconductor substrate; a gate region disposed onto the semiconductor substrate and positioned between the source region and the drain region; a gate oxide region disposed onto the semiconductor substrate in contact with the gate region; and a well region implanted onto the semiconductor substrate and under the gate region and the gate oxide region. The gate oxide region has a lower outer edge portion that contacts the well region.

Figure 1:
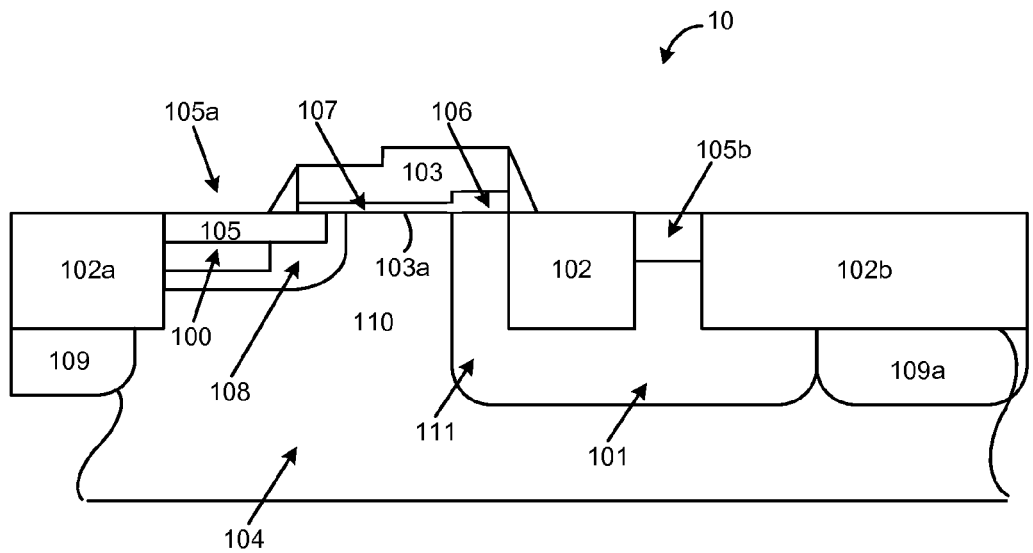
FIG. 1 shows a first cross-sectional view of a low threshold voltage LDMOS according to a first exemplary embodiment.

FIG. 1 shows a first cross-sectional view of a low threshold voltage LDMOS 10 according to a first exemplary embodiment. The LDMOS 10 may be formed onto a substrate of one conductivity type. For example, the LDMOS 10 may be an n-type LDMOS structure that is formed in a substrate consisting of a p-type material. The p-type material may include impurity atoms of an acceptor type that are capable of accepting an electron, such as, but not limited to, boron or aluminum.

A first heavily doped region of substantially opposite conductivity as the substrate represents a source region 105a disposed with a semiconductor substrate of the LDMOS 10. For example, the source region 105a may be disposed within a semiconductor substrate consisting of a p-type material.

A second heavily doped region of substantially opposite conductivity as the substrate represents a drain region 105b of the LDMOS structure 10. For example, the source region 105a and the drain region 105b may be implanted with N+ material to form a first N+ region corresponding to the source region 105a and a second N+ region corresponding to the drain region 105b, respectively. The "+" indicates that the region is implanted with a higher carrier concentration than a region not designated by a "+." For instance, an N+ region generally has a greater number of excess carrier electrons than an n-type region. A P+ region typically has a greater number of excess carrier holes than a p-type substrate. The n-type material may include impurity atoms of a donor type that are capable of donating an electron, such as, but not limited to, phosphorus, arsenic, or antimony to provide some examples.

A third heavily doped region of substantially opposite conductivity as the substrate represents a gate region 103 of the LDMOS structure 10. A polycrystalline silicon may heavily implanted with a substantially opposite conductivity as the substrate to form the gate region 103. For example, the polycrystalline silicon may be implanted with N+ material to form an N+ poly region corresponding to the gate region 103. The gate region 103 is positioned between the source region 105a and the drain region 105b.

A gate oxide 103a serves as an insulator between the gate region 103 and a channel region of the substrate that is between the source region 105a and the drain region 105b. The gate oxide 103a is positioned below and/or in contact with the gate region 103, between the source region 105a and the drain region 105b. The gate oxide 103a may be formed using a dielectric material such as silicon dioxide ($SiO_2$), though any suitable material may be used.

In FIG. 1, the gate oxide 103a includes a first portion, referred to as a first gate oxide 106, having a first thickness and a second portion, referred to as a second gate oxide 107, having a second thickness. The second gate oxide 107 may also be referred as the core gate oxide. In an embodiment, the first thickness may be approximately equal to the thin gate oxide of the low operating voltage process and the second thickness may be approximately equal to the thick gate oxide of the high operating voltage process. The first thickness of the first gate oxide 106 is thicker than the second thickness of the second gate oxide 107. For example, the first thickness may be approximately 10 Å. and the second thickness may be approximately 20 Å. A high field drift region 111 under the gate region 103 is protected by the first gate oxide 106. The high field drift region 111 has a width in the range of 0.05 um to 0.25 um, a height in the range of 0.1 um to 0.5 um, and a depth in the range of 0.3 um to 100 um.

The LDMOS structure 10 also includes a first shallow trench isolation (STI) 102, a second STI 102a, and a third STI 102b. The first STI 102 is disposed between the second STI 102a and the third STI 102b. The first STI 102 is proximal to the first gate oxide 106 and the second STI 102a is proximal to the second STI 102a.

A well region 104 is implanted onto the semiconductor substrate and under the gate region 103 and the gate oxide region 103a. The well region 104 includes a first well 101, a second well 109, and a third well 109a. In an embodiment, the gate oxide region 103a has a lower outer edge portion that contacts the first well 101. For example, the first well 101 is under the first STI 102 and also contacts the first gate oxide 106. The second well 109 is under the second STI 102a. The third well is under the third STI 102b. The first well 101 has a first height and a first length. The second well 109 has a second height and a second length. The third well 109a has a third height and a third length. In FIG. 1, the first height is greater or smaller than the second height. The second height and the third height are substantially the same. The first length is smaller or greater than the second and third lengths. The placement of the wells and the STI may generate a high performance high voltage semiconductor device. The first well and the second well are implanted with different material while the second and third wells are implanted with same material. In one embodiment, the first well is implanted with n-type material while the second and third wells are implanted with p-type material. In another embodiment, the first well is implanted with p-type material while the second and third wells are implanted with n-type material.

The first well 101 and the second well 109 may be spaced apart by a native layer mask, which is readily available in foundry processes. The gate oxides 106 and 107 may be deposited or grown. A thinner oxide region may be formed by removing the initial oxidation or deposition. A thicker oxide region may be formed by a second deposition or additional grown oxide.

A layer 100 is a lightly doped source layer. The layers 100 and 105 form the source region 105a. A pocket implant layer 108 is disposed under the source region 105a. The layer 100, the source region 105a, and the pocket implant layer 108 all touch a side surface of the second STI 102a. The pocket implant layer 108 may control the leakage level and threshold voltage of the LDMOS 10. The pocket implant layer 108 may also be referred as a halo implant region which is included to prevent punch-through. For example, the pocket implant layer 108 may hinder the depletion region from reaching the source region 105a. The pocket implant layer 108 may be doped with phosphorus atoms or arsenic atoms, to provide some examples. The pocket implant layer 108 is typically doped slightly more heavily than the wells.

There is a substrate region 110 between the first well 101 and the second well 109. The substrate region 110 is substantially under the second gate oxide 107. The substrate region 110 has a depth that is substantially the same as the first height of the first well 101 and substantially greater than the heights of the second and third wells 109 and 109a. The substrate region 110 has a width in the range of 0.1 um to 5 um, a height in the range of 0.1 um to 800 um, and a depth in the range of 0.3 um to 100 um. More preferably, the substrate region 110 has a width in the range of 0.1 um to 0.3 um, a height in the range of 0.3 um to 600 um, and a depth in the range of 0.3 um to 10 um.

Figure 2:
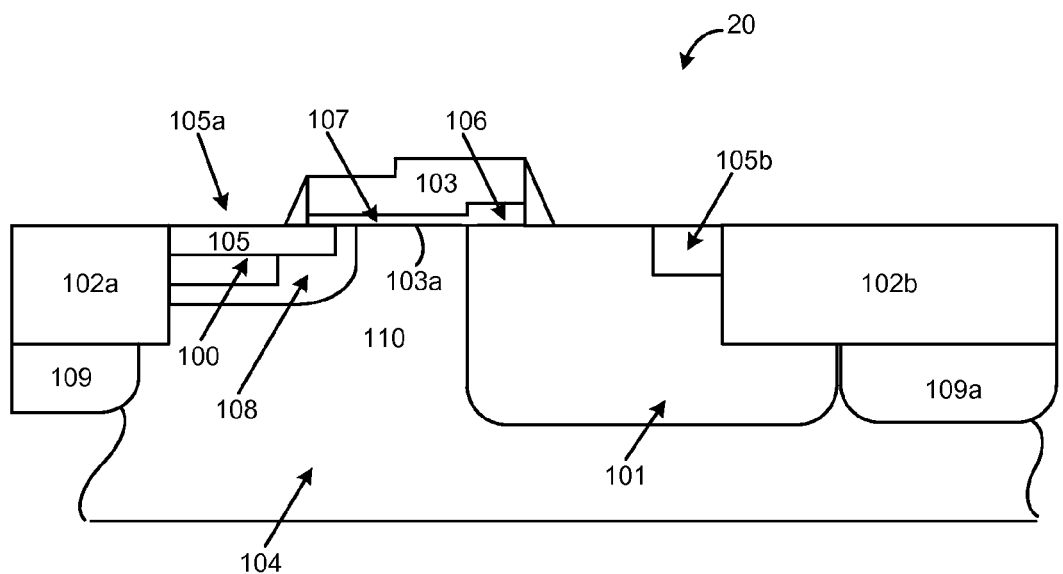
FIG. 2 shows a second cross-sectional view of a low threshold voltage LDMOS according to a second exemplary embodiment.

FIG. 2 shows a second cross-sectional view of a low threshold voltage LDMOS 20 according to a second exemplary embodiment. In an embodiment, the STI 102 in FIG. 1 may be removed. By removing the STI 102, the LDMOS becomes an active area based split gate oxide device.

Figure 3:
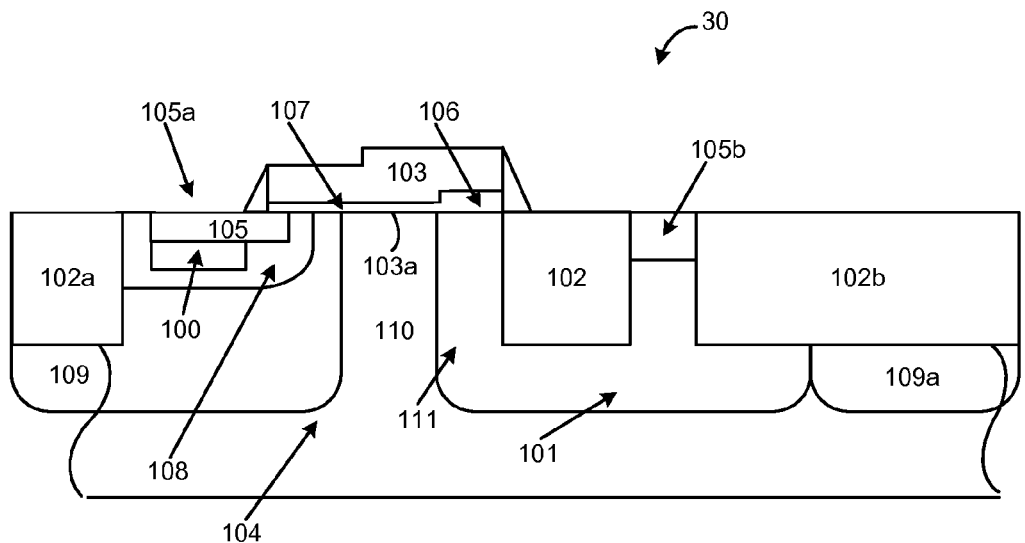
FIG. 3 shows a third cross-sectional view of a low threshold voltage LDMOS according to a third exemplary embodiment.

FIG. 3 shows a third cross-sectional view of a low threshold voltage LDMOS 30 according to a third exemplary embodiment. In an embodiment, the second well 109 extends under the pocket implant layer 108 and the second gate oxide 107. The second well 109 contacts a lower surface of the second STI 102a and a lower surface of the pocket implant layer 108. The pocket implant layer 108 surrounds the source region 105a. The pocket implant layer 108 contacts the second STI 102a.

In FIG. 3, the height of the second well 109 is greater, smaller or equal compared to the height of the first well 101. The substrate region 110 between the first well 101 and the second well 109 has a narrow width than the width in the substrate region 110 in FIGS. 1-2.

Figure 4:
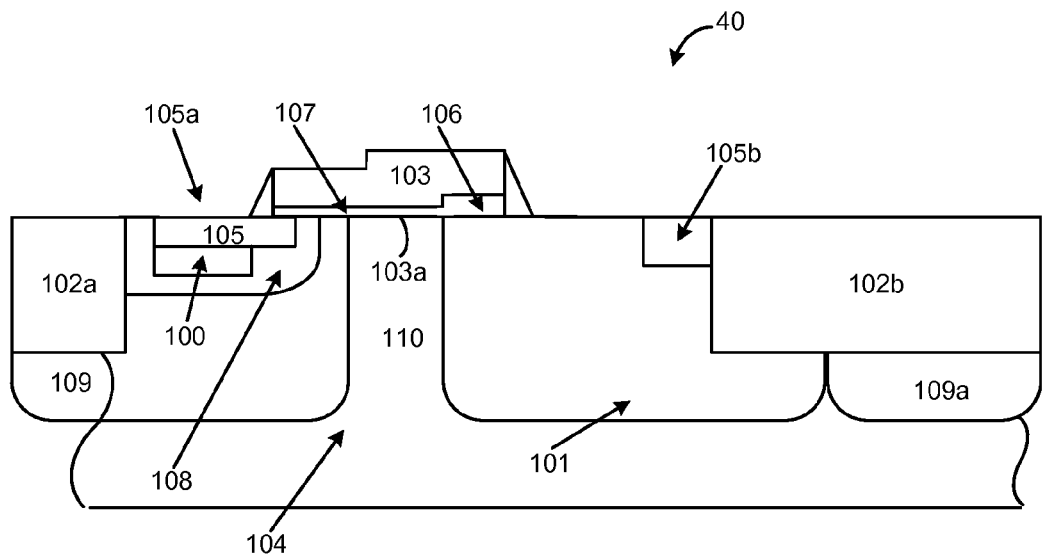
FIG. 4 shows a fourth cross-sectional view of a low threshold voltage LDMOS according to a fourth exemplary embodiment.

FIG. 4 shows a fourth cross-sectional view of a low threshold voltage LDMOS 40 according to a fourth exemplary embodiment. One of the differences between the fourth embodiment and the third embodiment is that the STI 102 in FIG. 3 is removed.

Figure 5:
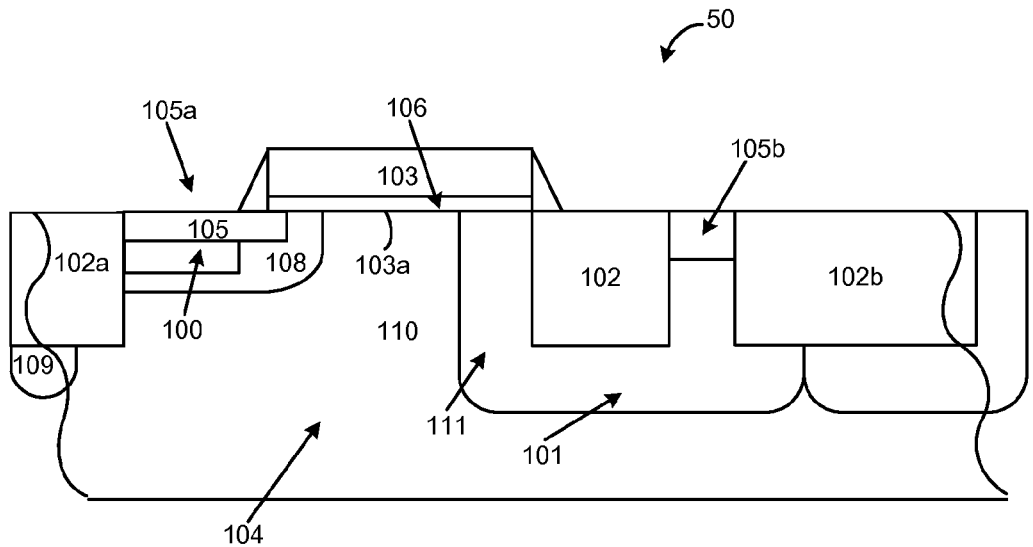
FIG. 5 shows a fifth cross-sectional view of a low threshold voltage LDMOS according to a fifth exemplary embodiment.

FIG. 5 shows a fifth cross-sectional view of a low threshold voltage LDMOS 50 according to a fifth exemplary embodiment. One of the differences between the fifth embodiment and the first embodiment is that both the gate region 103 and the gate oxide 106 have a uniform thickness. The first well 101 contacts a lower surface of the gate oxide 106. The source region 105a also contacts the lower surface of the gate oxide 106. The positions of the STI regions and the wells are similar as in the first embodiment in FIG. 1.

Figure 6:
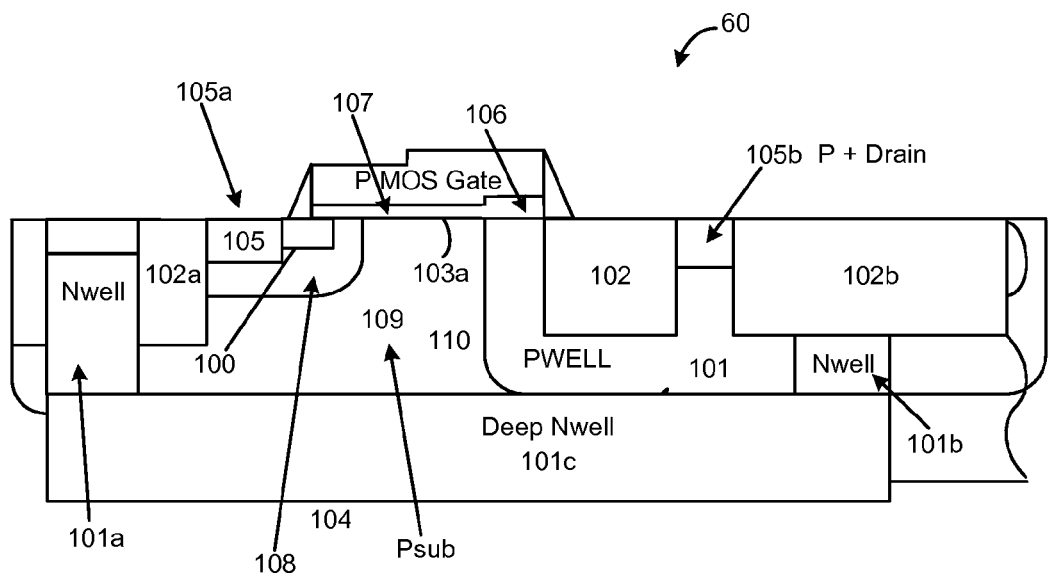
FIG. 6 shows a sixth cross-sectional view of a low threshold voltage LDMOS according to a sixth exemplary embodiment.

FIG. 6 shows a sixth cross-sectional view of a low threshold voltage LDMOS 60 according to a sixth exemplary embodiment. In an embodiment, the well region 104 includes a first well 101, a second well 101a, a third well 101b, and a deep well 101c. The first well 101 may be a P-well. The second well 101a and their well 101b may be N-wells. The deep well 101c may be a deep N-well. The first well 101 has a height greater than the height of the second and third wells. The deep well 101c is disposed under the first, second, and third wells. The second well 101a has a length that is substantially equal to the length of the third well 101b. The length of the first well 101 is substantially greater than the length of the second and third wells 101a and 101b. The deep well 101c has a length greater than the sum of the lengths of the first, second, and third wells 101, 101a, and 101b.

The source region 105a contacts the STI 102. However, the source region 105a does not contact the first gate oxide 106 and the second gate oxide 107. The layer 100 is disposed under the second gate oxide 107 and surrounded by the pocket implant layer 108. The substrate region 110 between the first well 101 and the second well 101a may be filled with P-substrate.

The disclosure may be applied to conventional LDMOS and p-channel lateral double diffused MOS (PLDMOS). The methodology may also be applied to complementary metal-oxide-semiconductor (CMOS) processes, Bipolar CMOS (BiCMOS) processes, as well as high K gate oxide processes.

All the above embodiments of semiconductor devices may be fabricated using conventional masks without incurring additional processing cost. More details of the fabricating process may be found in U.S. Pat. No. 7,161,213.

The methods, devices, and logic described above may be implemented in many different ways in many different combinations of hardware, software or both hardware and software. For example, all or parts of the apparatus may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. While various embodiments of the disclosure have been described, it will be apparent to those of ordinary skill in the art that many more embodiments and implementations are possible within the scope of the disclosure. Accordingly, the disclosure is not to be restricted except in light of the attached claims and their equivalents.

What is claimed is:

1. A semiconductor device, comprising:
a source region disposed within a semiconductor substrate;
a drain region disposed within the semiconductor substrate;
a gate region disposed on the semiconductor substrate and positioned between the source region and the drain region;
a gate oxide region disposed onto the semiconductor substrate in contact with the gate region;
a well region implanted into the semiconductor substrate under the gate region and the gate oxide region, the well region comprising a first well and a second well, and
a shallow trench isolation (STI) region disposed above the second well, the STI region disposed adjacent to the source region and separating the second well from the source region,
wherein the gate oxide region has a lower outer edge portion that contacts the well region,
wherein the gate oxide region comprises a first portion having a first thickness and a second portion having a second thickness, and
wherein the first well is disposed under the drain region, the first well is in direct contact with the first portion of the gate oxide region, and the first well is separated from the STI region disposed adjacent to the source region.

2. The semiconductor device of claim 1, wherein the gate region has an upper surface defining a step structure; and wherein the first well and the second well are implanted with different material.

3. The semiconductor device of claim 1, wherein the gate oxide region has a lower inner portion above a substrate region between the first well and the second well.

4. The semiconductor device of claim 1, wherein the source region, the drain region, and the gate region are implanted with n-type material.

5. The semiconductor device of claim 1, wherein the source region, the drain region, and the gate region are implanted with p-type material.

6. The semiconductor device of claim 1, wherein the first thickness is at least twice as thick as the second thickness.

7. The semiconductor device of claim 6, wherein the first well has a first length, the first well contacting the first portion and being separated from the second portion.

8. The semiconductor device of claim 7, wherein the second well has a second length shorter than the first length.

9. A semiconductor device, comprising:
a source region disposed within a semiconductor substrate;
a drain region disposed within the semiconductor substrate;
a gate region disposed on the semiconductor substrate and positioned between the source region and the drain region;
a gate oxide region disposed onto the semiconductor substrate in contact with the gate region;
a first well implanted into the semiconductor substrate and contacting the gate oxide region, the first well having a first height, and
a second well implanted into the semiconductor substrate under a first shallow trench isolation (STI) region, the second well having a second height and separated from the source region,
wherein the first height is greater than the second height,
wherein the gate oxide region comprises a first portion having a first thickness and a second portion having a second thickness,
wherein the drain region is disposed between a second STI region and a third STI region, and
wherein the first well is in direct contact with the first portion of the gate oxide region and is separated from the first STI region.

10. The semiconductor device of claim 9, wherein the first thickness is greater than the second thickness, and the first well being separated from the second portion.

11. The semiconductor device of claim 9, wherein a substrate region is disposed between the first well and the second well, the substrate region extending below the gate oxide region and a pocket implant layer that is in contact with the STI region.

12. The semiconductor device of claim 11, further comprising a third well that contacts the first well.

13. The semiconductor device of claim 12, wherein the substrate region has a depth greater than the second height.

14. The semiconductor device of claim 12, wherein the substrate region has a depth substantially equal to the first height.

15. The semiconductor device of claim 12, wherein the first well has a first length and the second well has a second length, and wherein the first length is greater than the second length.

16. The semiconductor device of claim 15, wherein the third well has a third length and the third length is greater than the second length.

17. A laterally diffused metal oxide semiconductor (LDMOS) device, comprising:
a source region disposed with a semiconductor substrate;
a drain region disposed with the semiconductor substrate;
a gate region disposed onto the semiconductor substrate and positioned between the source region and the drain region, the gate region having at least two different gate thicknesses along its length;
a gate oxide region disposed onto the semiconductor substrate in contact with the gate region;
a first well established in the semiconductor substrate and contacting the gate oxide region and the drain region, the first well having a first length;
a second well established in the semiconductor substrate under a first shallow trench isolation (STI) region, the second well having a second length, and
a third well established in the semiconductor substrate directly under a second STI region, the third well having a third length,
wherein a substrate region is formed between the first well and the second well,
wherein the gate oxide region comprises a first portion having a first oxide thickness and a second portion having a second oxide thickness, wherein the first well and the third well are implanted with different materials, and wherein the first well is in direct contact with the first portion of the gate oxide region and is separated from the first STI region.

18. The LDMOS device of claim 17, wherein:

the source region, drain region, and gate region comprise n-type implantation;

the second well is separated from the source region by the first STI region; and the first STI region is disposed adjacent to the source region.

19. The LDMOS device of claim 18, wherein:

the first well is implanted with p-type material, and the second well and the third well are implanted with n-type material.

20. The LDMOS device of claim 18, wherein:

the first well is implanted with n-type material, and the second well and the third well are implanted with p-type material.

* * * * *